United States Patent
Maslennikov et al.

(10) Patent No.: US 7,440,733 B2
(45) Date of Patent: *Oct. 21, 2008

(54) CONSTANT GAIN NONLINEAR ENVELOPE TRACKING HIGH EFFICIENCY LINEAR AMPLIFIER

(75) Inventors: Nikolai Maslennikov, Huntington Beach, CA (US); Mark Gurvich, Costa Mesa, CA (US); Alexander Rabinovich, Cypress, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 387 days.

This patent is subject to a terminal disclaimer.

(21) Appl. No.: 11/087,225

(22) Filed: Mar. 23, 2005

(65) Prior Publication Data

US 2005/0227644 A1    Oct. 13, 2005

Related U.S. Application Data

(60) Provisional application No. 60/560,889, filed on Apr. 9, 2004.

(51) Int. Cl.
*H04B 1/04* (2006.01)
*H04Q 7/20* (2006.01)

(52) U.S. Cl. .................. 455/114.3; 455/127.2; 330/10; 330/136

(58) Field of Classification Search ... 455/127.1–127.3, 455/114.2–114.3; 330/10, 136, 149
See application file for complete search history.

(56) References Cited

U.S. PATENT DOCUMENTS

| | | | |
|---|---|---|---|
| 3,900,823 A | 8/1975 | Sokal et al. | 330/149 |
| 4,320,350 A | 3/1982 | Drapac | 330/202 |
| 4,346,349 A | 8/1982 | Yokoyama | 330/10 |
| 5,142,240 A * | 8/1992 | Isota et al. | 330/149 |
| 5,287,069 A | 2/1994 | Okubo et al. | 330/10 |
| 5,757,229 A | 5/1998 | Mitzlaff | 330/124 |
| 5,777,519 A | 7/1998 | Simopoulos | 330/297 |
| 5,786,727 A | 7/1998 | Sigmon | 330/124 |

(Continued)

OTHER PUBLICATIONS

Liu et al., "Considerations on Applying OFDM in a Highly Efficient Power Amplifier". IEEE Transactions on Circuits and Systems—II Analog and Digital Signal Processing, vol. 46, No. 11, Nov. 1999, pp. 1329-1335.

(Continued)

*Primary Examiner*—Lee Nguyen
(74) *Attorney, Agent, or Firm*—Myers, Dawes, Andras & Sherman LLP (57) ABSTRACT

An envelope tracking radio frequency (RF) power amplifier having an adaptive envelope signal processing circuit is disclosed. An RF input voltage is sampled by the adaptive envelope signal processing circuit which provides control signals to the power supply which supplies voltages to RF power devices in order to simultaneously satisfy two operating conditions: a) provide best possible efficiency of the power amplifier stages depending on the input signal characteristics and b) provide compensation for RF transistor AM-AM and AM-PM distortion compensation across the power range. In particular, the voltage control provides for constant power amplifier gain across the input signal dynamic range, thus minimizing power amplifier amplitude distortions and extending the useful power amplifier linear dynamic range up to saturation point. The power amplifier thus exhibits better linearity and efficiency than offered by conventional techniques and topologies.

20 Claims, 4 Drawing Sheets

U.S. PATENT DOCUMENTS

| | | | |
|---|---|---|---|
| 5,789,984 A | 8/1998 | Davis et al. | 330/279 |
| 5,793,253 A | 8/1998 | Kumar et al. | 330/124 |
| 5,929,702 A | 7/1999 | Myers et al. | 330/136 |
| 6,043,707 A * | 3/2000 | Budnik | 330/10 |
| 6,081,161 A | 6/2000 | Dacus et al. | 330/297 |
| 6,112,062 A | 8/2000 | Hans et al. | 455/114.3 |
| 6,157,253 A | 12/2000 | Sigmon et al. | 330/10 |
| 6,239,656 B1 | 5/2001 | Nagata et al. | 330/124 |
| 6,268,768 B1 | 7/2001 | Blodgett | 330/107 |
| 6,297,696 B1 | 10/2001 | Abdollahiam et al. | 330/124 |
| 6,300,826 B1 | 10/2001 | Mathe et al. | 330/10 |
| 6,362,685 B1 | 3/2002 | Vagher | 330/124 |
| 6,437,641 B1 | 8/2002 | Bar-David | 330/10 |
| 6,515,541 B2 | 2/2003 | Cheng et al. | 330/51 |
| 6,566,944 B1 | 5/2003 | Pehlke et al. | 330/10 |
| 6,583,664 B2 | 6/2003 | Mathe et al. | 330/10 |
| 6,590,451 B2 | 7/2003 | McRory | 330/149 |
| 6,617,920 B2 | 9/2003 | Staudinger et al. | 330/149 |
| 6,617,929 B2 | 9/2003 | Kim et al. | 330/295 |
| 6,661,284 B1 | 12/2003 | Luz et al. | 330/124 |
| 6,677,819 B1 | 1/2004 | Hakala et al. | 330/136 |
| 6,735,419 B2 * | 5/2004 | Mitzlaff | 455/127.1 |
| 2002/0171477 A1 | 11/2002 | Nakayama et al. | 330/53 |
| 2002/0186079 A1 | 12/2002 | Kobayashi | 330/124 |
| 2003/0214355 A1 | 11/2003 | Luz et al. | 330/124 |
| 2004/0174212 A1 | 9/2004 | Kim et al. | 330/124 |
| 2005/0242875 A1 * | 11/2005 | Gurvich et al. | 330/136 |

OTHER PUBLICATIONS

Jonathan Lees, Martin Gross, Johannes Benedikt, Paul J. Tasker, "Single-Tone Optimization of an Adaptive-Bias Doherty Structure", IEEE-MTT-S Digest 2003, pp. 2213-2216.

Guillermo Gonzalez, "Microwave Transistor Amplifiers, Analysis and Design", Prentice-Hall, 1997, ISBN 0-13-254335-4, Second Edition.

Cavers, "Amplifier Linearization Using a Digital Predistorter with Fast Adaptation and Low Memory Requirements", Vehicular Technology, IEEE Transactions, vol. 39, Issue 4, Nov. 1990, pp. 374-382.

J.G. McRory and R.H. Johnson, "An RF Amplifier for Low Intermodulation Distortion" 1994, IEEE MTT-S Digest, pp. 1741-1744.

M. Faulkner and M.A. Briffa, "Amplifier Linearization Using RF Feedback and Feedforward Techniques", 1996 IEEE VTC Proceedings, pp. 525-529.

R.G. Villanueva and H.J. Aguilar, "Amplifier Linearization Through the Use of Special Negative Linear Feedback", IEE Proceedings, Circuits, Devices and Systems, vol. 143, No. 1, Feb. 1996, pp. 61-67.

* cited by examiner

CONSTANT GAIN NONLINEAR ENVELOPE TRACKING HIGH EFFICIENCY LINEAR AMPLIFIER

RELATED APPLICATION INFORMATION

The present application claims priority under 35 USC Section 119(e) to provisional application Ser. No. 60/560,889 filed Apr. 9, 2004, the disclosure of which is incorporated herein by reference in its entirety.

FIELD OF THE INVENTION

The invention relates in general to power amplifiers and, more particularly, to high efficiency power amplifier circuits. More particularly, the invention relates to amplifiers operating at microwave frequencies with high peak to average ratio input RF signals.

BACKGROUND OF THE INVENTION

Modern cellular communication systems employ RF power amplifiers in their base stations, in order to provide communication means to subscribers. To achieve maximum utilization of available spectrum power amplifiers are required to amplify multiple Radio Frequency (RF) carriers. In addition to multiple RF carriers, each RF carrier employs a digital coding scheme such as Code Division Multiple Access (CDMA), which allows for multiple users to utilize the same spectrum. In addition to CDMA, there are systems that employ a modulation format known as Orthogonal Frequency Division Multiplexing (OFDM), in which the signal from a single user is first subdivided. Each subdivision is then modulated by a multiplicity of staggered sub carriers. The modulated sub carriers are then added up, thus causing large peak excursions in the RF signal carriers. RF carriers modulated with large peak-to-average ratio signals require conventional RF amplifiers that are costly and relatively inefficient. One reason for such inefficiency is that a conventional RF power amplifier becomes efficient only during the occurrence of high output signal levels, i.e., when the instantaneous power output is large. However, during most of the time, the average power output is only a small fraction of the peak power, resulting in low overall efficiency, typically below 10%. Therefore, it is highly desirable to employ RF power amplifier circuits that incorporate high efficiency techniques, which can provide efficient operation over a wide dynamic back-off range.

One possible solution for improvement of efficiency in high power amplifiers involves the use of envelope elimination and restoration (EER). EER is a technique that employs high efficiency power amplifiers, which can be combined to produce a high efficiency linear amplifier system. In this method, a modulated input signal is split into two paths: an amplitude path through which the envelope of the modulated input signal is processed, and a phase path through which the phase modulated carrier of the modulated input signal is processed. In order for the EER technique to be effective the envelope of the modulated input signal is amplified with a highly efficient, narrow band amplifier. Conjunctionally, a high efficiency amplifier is used to amplify the high frequency phase modulated carrier with the amplified envelope signal. The EER technique is unique in that the amplifier, which generates the amplified envelope signal, also acts as the DC power supply to the high frequency amplifier. The efficiency of such EER amplifier systems can be calculated by multiplying the efficiencies of the two amplifiers. For example, if the efficiency of the first amplifier is 50 percent and that of the second amplifier efficiency is 40 percent, the total efficiency of the EER amplifier system will be 0.50*0.40=0.2 or 20 percent.

While these prior EER approaches may offer viable efficiency enhancement solutions, they add additional complexity due to support circuits and diminished linearity over operating conditions. Therefore, the desired combination of linearity and efficient operation, especially where large peak signals are present, has not yet been achieved.

Past amplifier measurements have confirmed that adequate inter-modulation distortion (IMD) performance requires that the amplifier's saturated power (Psat) must be greater than or equal to the amplified input signal's peak power ($P_{peak}$). If a power amplifier has been tuned for a maximum peak power ($P_{sat}$), this parameter basically depends on DC supply voltage (Vds). Due to their statistical nature, digital signal's peak power levels occur infrequently and their duration is very short near Psat levels. Therefore, it can be stipulated that the output stage of the power amplifier requires high drain supply voltage levels Vds only during these high power level excursions and for a short duration. Statistical signal analyses of digital signals indicate that that the output stage of the power amplifeir doesn't require high voltage during the majority of its operating time. It is advantageous to decrease Vds while tracking the input signal's envelope, which in turn will decrease average power consumption. A decrease in DC power consumption directly improves overall amplifier efficiency. On the other hand, any variation in Vds results in a gain and phase variation in a transistor stage. Gain and phase variation vs. Vds must be controlled if a dynamic Vds system is to be implemented. Constant AM-AM and AM-PM are the key requirements for power amplifier linearity.

Therefore, a need presently exists for a high efficiency power amplifier design which provides the desired linearity despite high peak to average power ratio input RF signals.

SUMMARY

In a first aspect the present invention provides a power amplifier system comprising an input for receiving an RF input signal including a modulated RF carrier having a dynamically varying envelope. An RF amplifier receives and amplifies the RF input signal including the carrier and envelope. The RF amplifier has a power supply input and the RF amplifier has a saturation region. The power amplifier system further comprises a DC power supply and a variable power supply circuit coupled to the input, the DC power supply and the RF amplifier power supply input. The variable power supply circuit provides a supply voltage to the RF amplifier which increases with the input signal power to maintain substantially constant RF amplifier gain up to the beginning of the amplifier saturation region. A phase compensation circuit is provided which adjusts the phase of the input signal to compensate for phase variations due to the variable power supply.

In a preferred embodiment of the power amplifier system the variable power supply circuit comprises an envelope detector coupled to the input and an envelope amplifier responsive to the output of the envelope detector and coupled to the DC power supply and RF amplifier. The variable power supply circuit preferably provides a substantially constant power supply voltage over a first lower power input signal region and provides a continuously increasing power supply voltage in a second higher power input signal region. For example, the power supply voltage may vary from about 10 volts in the first region to about 30 volts in the saturation region. The RF amplifier may comprise one or more LDMOS amplifier devices which are preferably biased in class AB. The phase compensation circuit may comprise a phase adjuster, coupled between the input and RF amplifier for adjusting the phase of the input signal, and a predistorter providing a control signal to the phase adjuster based on the input signal magnitude. The predistorter controls the phase adjuster to provide little or no phase adjustment in the first input signal region and a continuously increasing phase adjustment in the second input signal region. For example, the phase adjustment in the second region may vary over a range of about 30 degrees.

According to another aspect the present invention provides a method for amplifying a high frequency modulated signal. The method comprises receiving a high frequency modulated input signal having a carrier and a dynamically varying envelope providing a varying input signal power. The method further comprises amplifying the high frequency modulated input signal, including the carrier and varying envelope, with a power amplifier module, the power amplifier module having a saturation region. The method further comprises providing a DC supply voltage to the power amplifier module, detecting a signal related to the power of the high frequency modulated input signal, and controlling the DC supply voltage of the power amplifier module in response to the detected signal to maintain substantially constant gain up to the beginning of the saturation region. The method further comprises adjusting the phase of the input signal to compensate for phase variations introduced by controlling the supply voltage of the power amplifier module.

In a preferred embodiment of the method for amplifying a high frequency modulated signal, controlling the DC supply voltage comprises maintaining a substantially constant supply voltage over a first input signal power range and continuously increasing the DC supply voltage over a second higher power input signal power range. The second input signal power range extends from a transition region to the beginning of the saturation region of the power amplifier module. For example, continuously increasing the DC supply voltage may comprise increasing the supply voltage from about 10 volts to about 30 volts. Detecting a signal related to the power of the input signal preferably comprises detecting the envelope of the input signal. The high frequency signal may be an RF CDMA or WCDMA signal.

According to another aspect the present invention provides a method for amplifying a high frequency modulated signal. The method comprises receiving a high frequency modulated input signal having a carrier and a dynamically varying envelope which provides a varying input signal power. The method comprises amplifying the high frequency modulated input signal, including the carrier and varying envelope, with a power amplifier module, the power amplifier module having a saturation region. The method further comprises detecting a signal related to the power of the high frequency modulated input signal and providing a variable DC supply voltage to the power amplifier module in response to the detected signal which continuously increases in a higher power input signal range extending up to the beginning of said saturation region. The method further comprises adjusting the phase of the input signal with a continuously increasing phase adjustment in the higher power signal range. As a result the gain and phase are maintained substantially constant up to the beginning of the saturation region.

In a preferred embodiment of the method for amplifying a high frequency modulated signal, providing a variable DC supply voltage further comprises maintaining a substantially constant supply voltage over a lower power input signal range below the higher power input signal power range. The input signal may be a CDMA or WCDMA modulated RF signal. For example, adjusting the phase may comprise adjusting the phase from about 0 degrees to about 30 degrees continuously through the higher power input signal range. Detecting a signal related to the power of the input signal preferably comprises detecting the envelope of the input signal.

Further features and advantages of the present invention are set out in the following detailed description.

DETAILED DESCRIPTION OF THE INVENTION

The present invention is directed to improving the linearity and enhancing the efficiency of RF power amplifiers operated with signals having high dynamic range, and, more particularly, to an amplifier operating at microwave frequencies with high peak to average ratio input RF signals.

First the general principles and method of operation will be described. Intermodulation distortion stems from nonlinear amplitude and phase response characteristics inherent to high power devices when operated near maximum output power levels. The present invention addresses linearity and efficiency requirements by monitoring a detected input envelope waveform, processing it, and controlling supply voltages to power devices and adjusting the phase and amplitude of the incident RF signal so as to achieve the best possible AM-AM and AM-PM response possible, while achieving efficient performance.

More specifically, the RF input signal is detected by an envelope detector. The instantaneous envelope signal is processed through a deterministic function. The function produces respective control signals through the linear power supply/supplies for use throughout the amplifier control elements in order to minimize undesired AM-AM and AM-PM response caused both by transistor static nonlinearities and drain voltage modulation induced nonlinearities while maintaining optimum RF to DC efficiency by keeping transistors close to saturation. Preferably, the nonlinear voltage supply circuit maintains constant RF amplifier gain across the output signal dynamic range. The maximum linear output power from the amplifier may be chosen equal to the amplifiers' saturated output power capability without sacrificing full dynamic range linearity. Therefore, the present invention allows increasing of the average operating power point in comparison to conventional amplifiers. Increasing the average operating power point results in an increase of the RF to DC efficiency. Preferably, residual AM/PM modulation is controlled by means of an envelope controlled phase shifter at the input of the envelope tracking amplifier.

The approach of the present invention has several advantages and overcomes deficiencies in prior approaches in providing a high efficiency amplifier. Amplifier measurements have confirmed that adequate IMD (Inter Modulation Distortion) performance requires that the amplifier's saturated power output level ($P_{sat}$) must be greater than or equal to the amplified input signal's peak power ($P_{peak}$). If the power amplifier has been tuned for a maximum saturated power output level ($P_{sat}$), this parameter basically depends on DC supply voltage (Vds) levels and device matching structure. Due to the nature of digital signals, peak power levels occur statistically infrequently and their duration is very short near ($P_{sat}$) levels. Therefore, the output stage of the power amplifier requires high drain supply voltage levels (Vds) only during these high power level excursions and for a short duration. Statistical signal analyses of digital signals indicate that the output stage of the power amplifier does not require high voltage during the majority of its operating time. It is, therefore, advantageous to decrease the nominal drain supply voltage levels (Vds) while tracking the input signal's envelope and providing higher Vds only when needed, which in turn will decrease average power consumption of the overall power amplifier. A decrease in DC power consumption directly improves overall amplifier efficiency.

Variation in Vds results in a gain and phase variation in each amplification stage. Gain and phase variation vs. Vds should be controlled since constant dynamic gain and phase responses are desirable for overall power amplifier linearity. The present invention controls the supply voltage of the amplifier to track the input RF signal variations, preferably utilizing a signal detector in conjunction with a tracking power supply as well as controlling amplifier AM-AM and AM-PM response over the operating power range.

Next, referring to FIGS. 1 through 7, a specific implementation of the invention will be described.

Figure 1:
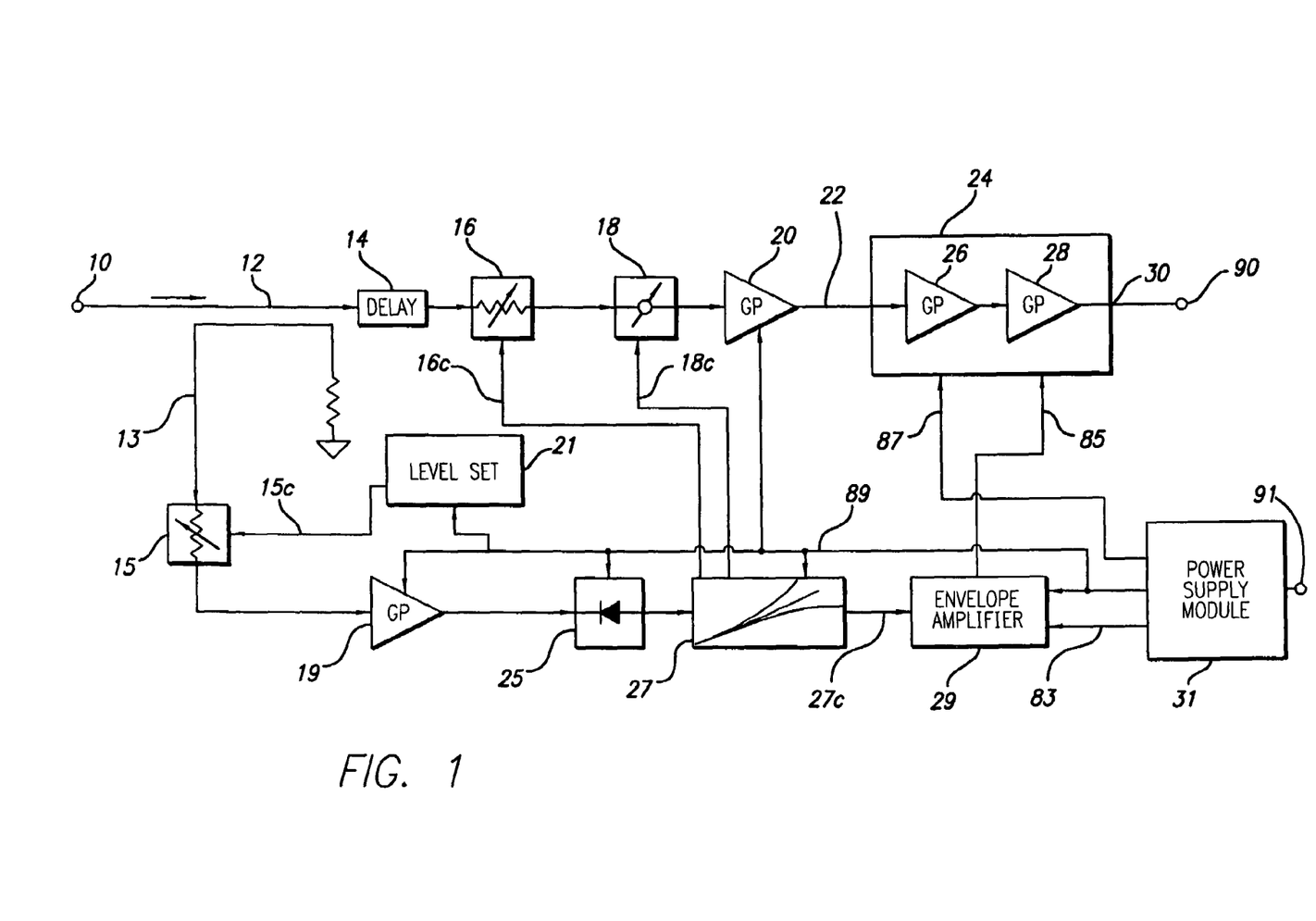
FIG. 1 is a block schematic drawing of a preferred embodiment of the invention.

FIG. 1 illustrates an exemplary RF power amplifier according to one embodiment of the present invention. An input signal is applied to input port 10. The input signal is a high frequency modulated signal with an RF carrier, for example, employing CDMA or WCDMA modulation. Such signals typically have a carrier in the GHz range and more specifically typically in the 1-10 GHz range, and a modulated envelope typically in the high KHz range or MHz range and more specifically typically in the range of about 900 KHz to 15 MHz. A majority of the input signal, including both the carrier and envelope, is provided along a main signal path (upper path in FIG. 1) by directional coupler 12 to delay 14 and first voltage variable attenuator 16. Directional coupler 12 also transfers a portion of the input RF signal, including both carrier and envelope, along a second signal path 13 from the input port to the input of a second voltage variable attenuator 15. Those skilled in the art will appreciate that first voltage variable attenuator 16 and second voltage variable attenuator 15 may be conventional circuits and various embodiments can be used for these circuits. The output of second voltage variable attenuator 15 is coupled to an input of a wide dynamic gain stage 19, which may be a conventional high dynamic range amplifier circuit. The output of the gain stage 19 is a level stabilized radio frequency signal, as processed by second voltage variable attenuator 15 and high dynamic range amplifier stage 19, which is input to a linear envelope detector 25. More specifically, input signal levels are level stabilized with second voltage variable attenuator 15 and high dynamic range amplifier stage 19 by control line 15c which addresses gain variations of the high dynamic range amplifier stage 19 as well as the input RF signal types.

Linear envelope detector 25 receives the level stabilized radio frequency signal output from the high dynamic range amplifier stage 19 and determines the envelope amplitude of the signal. Design of suitable envelope detector circuits are known in the art and can include a diode and other passive linear and/or nonlinear components which function to filter the carrier frequency from the radio frequency signal sample and present its envelope amplitude at an output. The envelope amplitude of the radio frequency signal from linear envelope detector 25 is conveyed to predistorter 27. Envelope based predistorter circuit 27 generates first, second and third control voltage signals provided along lines 16c, 18c and 27c, respectively, for use with attenuator 16, phase shifter 18 and envelope amplifier 29. More specifically, in the second signal path, (lower path of FIG. 1), envelope amplifier 29 is coupled to receive the third output 27c of the envelope predistorter 27. The third output 27c of the envelope predistorter 27 contains the envelope fundamental frequency as well as higher order harmonics of the envelope frequency. The third output 27c of the envelope predistorter 27 is used by the envelope amplifier 29 to control the drain supply voltage to main path amplifier module 24 provided along line 85 from power supply module 31, which is used to provide constant power amplifier gain by adjusting the amplifier back off, i.e., the ratio of the power supply to a nominal input signal power.

Still referring to FIG. 1, in the main signal path (top path of FIG. 1), directional coupler 12 transfers the bulk of the input RF signal 10 to the input port of the delay line 14. The delayed RF signals are coupled to the input of the first voltage variable attenuator 16. The first output of the envelope based predistorter circuit 27 provided along line 16c adjusts the control voltage of the variable attenuator 16 and is used to flatten the AM-AM response of the amplifier system as described in more detail below. The attenuated input signal is then coupled to a phase shifter network 18. Phase shifter 18 is responsive to the second output of the envelope based predistorter circuit 27 provided along line 18c and is used to flatten the AM-PM response of the amplifier system as described in more detail below. The output of phase shifter 18 is provided to driver stage 20, which may provide a pre-amplification to the RF signal, and the output of driver 20 is provided to high power RF amplifier module 24. High power RF amplifier module 24 is employed to amplify the RF input signal levels, including the RF carrier and modulated envelope. Such power RF amplifier can employ any of a number of topologies, but presently a multi-stage LDMOS Class AB biased module provides an optimum efficiency-linearity implementation. Those skilled in the art will appreciate that other semiconductor technologies can be used as well, such as, but not limited to GaAs, Bipolar, etc., as well as vacuum tubes such as TWT and the like. Preferably, output power stages 28 are biased in Class-AB bias, while low power drive stages 26 can biased in Class-AB or A. Because of differences in operating regimes it is desirable that driver stage 26 is fed from an independent DC supply 87 from power stage(s) 28 which have a separate DC supply 85 provided via envelope amplifier 29. One suitable implementation of an envelope amplifier is disclosed in copending utility application filed Mar. 16, 2004 for a High Efficiency Amplifier Employing Dynamically Controlled Back Off, which claims priority to provisional application Ser. No. 60/554,648 filed Mar. 19, 2004, the disclosures of which are incorporated herein by reference in their entirety.

Figure 2:
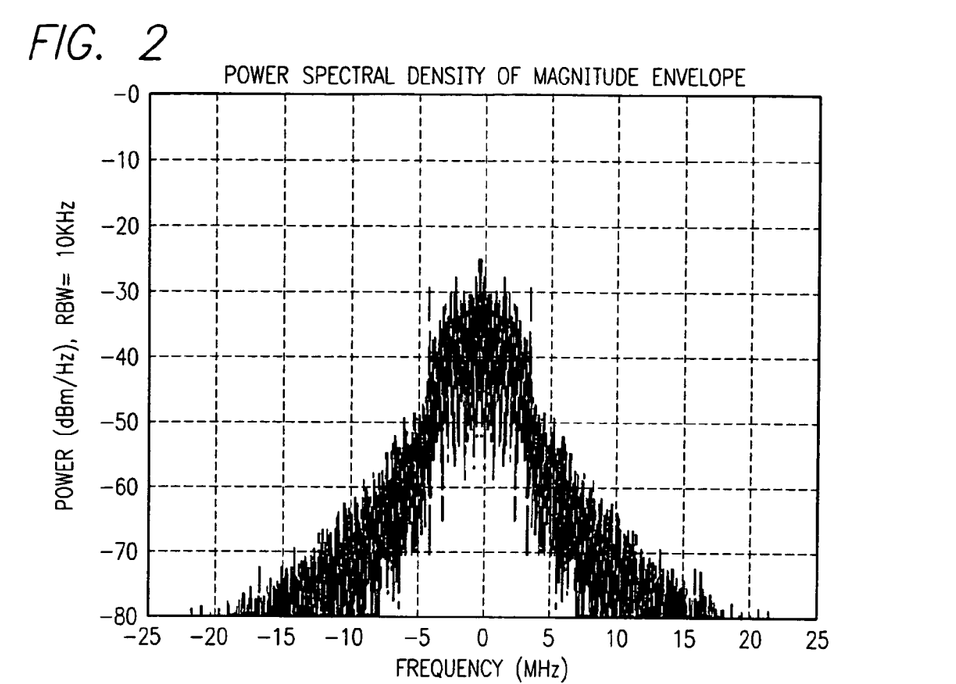
FIG. 2 is a graph of the power spectrum density of a representative WCDMA envelope signal.
Figure 3:
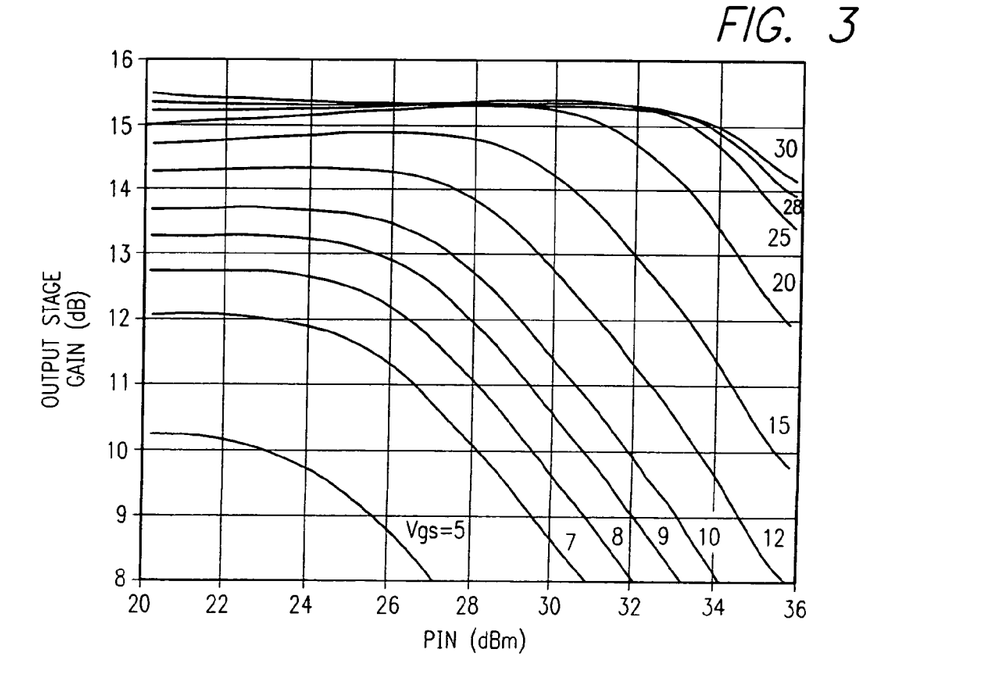
FIG. 3 is a graph showing gain vs. Pin for various values of Vds for a representative power amplifier device
Figure 4:
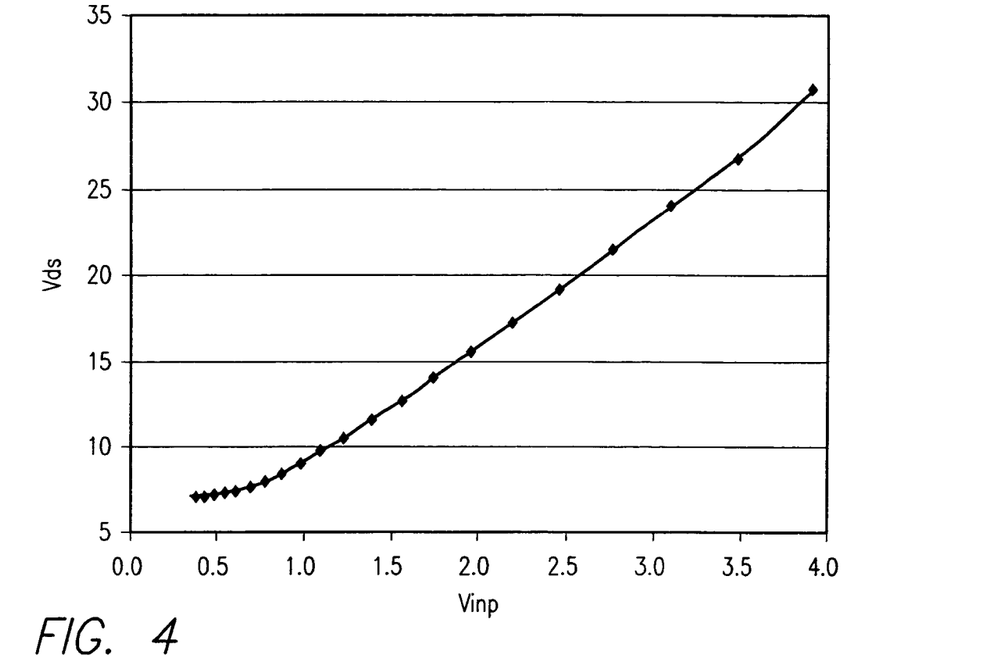
FIG. 4 is a graph showing a variable drain supply voltage Vds vs. instantaneous input envelope RF voltage for providing substantially constant RF power amplifier gain in accordance with the present invention.
Figure 6:
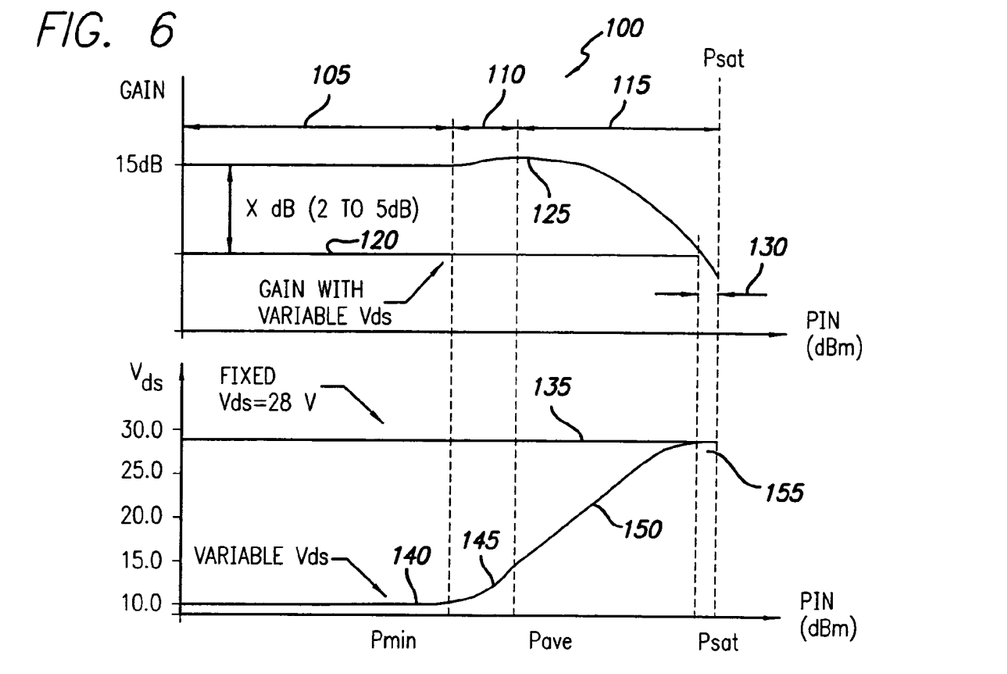
FIG. 6 is a graph showing output amplifier stage gain vs. Pin for both a fixed Vds drain supply voltage and for a dynamically adjusted Vds in accordance with the invention.

FIG. 4, depicts the dependence of the drain voltage (Vds) (provided along line 85 in FIG. 1) versus instantaneous input envelope RF voltage that results in constant gain (e.g., 12 dB) for output stage 28 (shown in FIG. 1). This constant gain is shown in FIG. 6, by curve reference numeral 120. This functional dependence can be extracted from gain versus Pin for various values of Vds as presented in FIG. 3 for output amplifier stage 28. Those skilled in the art will recognize by examining the gain curves of FIG. 3 that a lower drain supply voltage (Vds) as provided on line 85 in FIG. 1 (for example 20V dc) will result in a gain decrease (approximately 3-dB) relative to the nominal gain (15 dB for the output stage 28 operating at 28 V dc). By the same token operating output stage 28 at a reduced supply voltage Vds, will yield better efficiency than can be afforded by a fixed supply voltage due the fact that for a given instantaneous input RF signal the drain supply voltage is adjusted up or down accordingly. In addition to an improvement in operating efficiency, the nonlinear function applied to the detected envelope (a representative WCDMA envelope is shown in FIG. 2) will result in a constant gain operation of output stage 28 by continuously adjusting drain supply voltage (Vds) to the output stage 28 along line 85 (FIG. 1) as a function of input RF signal envelope (FIG. 4 and FIG. 6). For example, the drain supply voltage may vary from a constant 10 volts in lower power region 105 to a maximum value of about 30 volts in the saturation region 155 with a continuously increasing voltage through region 115.

Referring to FIG. 6 graphical representations of gain vs. input power (Pin) for a fixed drain supply voltage and variable supply voltage are disclosed. In addition to gain vs. input power (Pin) curves, voltage vs. input power (Pin) curves are shown below the gain curves. More specifically, a constant drain supply voltage (Vds=28 Vdc in the illustrated example) Gain vs. Pin curve is shown (curve 125) along with the variable drain curve supply (curve 120) which provides substantially constant gain. Three representative input power (Pin) regions 105, 110 and 115 are shown corresponding to a lower power input signal region 105, a transition region 110 and a higher power input signal region 115 ending at a saturation region 130. From these typical gain curves, constant drain supply voltage curve 125 demonstrates a nonlinear AM-AM characteristic as evidenced by gain expansion as the device transitions from Class A operation in region 105 into a Class B bias mode in region 110 and gain compression in region 115. This response in region 115 is typical of Class B or AB operation as output stage device 28 is being driven to higher output levels, closer to saturated output power level ($P_{sat}$) 130. The above mentioned AM-AM behavior is undesirable due to its introduction of a nonlinear response over the dynamic range. The present invention addresses this nonlinear behavior by dynamically adjusting the drain supply voltage to the output stage device 28 (FIG. 1) as a function of input RF envelope signal. This is indicated with the substantially constant gain curve 120. The dynamically adjusted drain supply voltage curve is shown in the bottom graph of FIG. 6 by curves 140, 145, 150 and 155 in the different Pin regions along with a constant supply voltage curve 135 for comparison.

Figure 5:
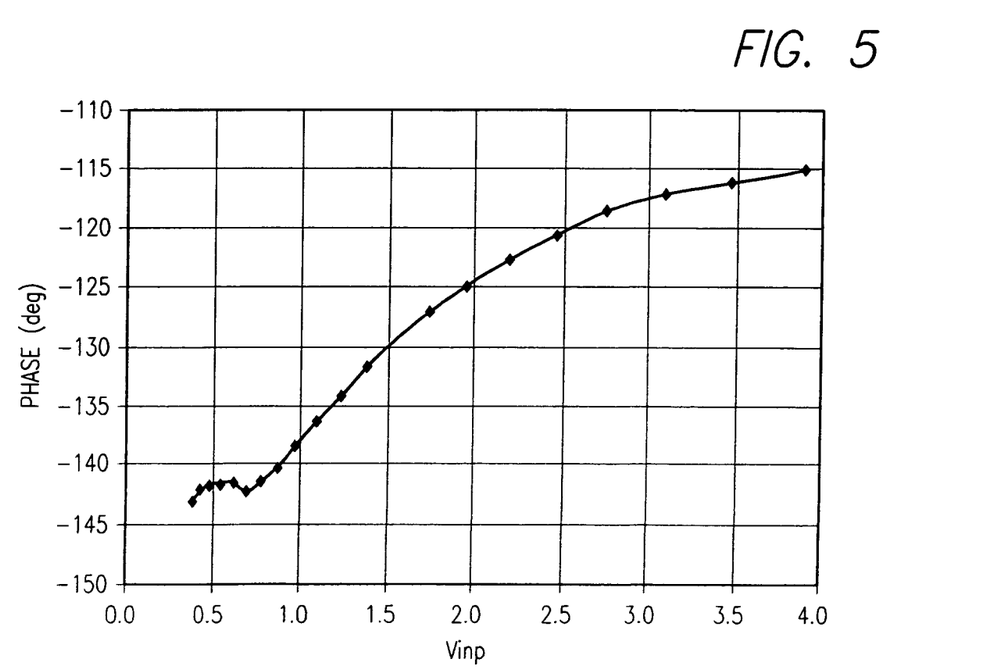
FIG. 5 is a graph showing phase vs. instantaneous input envelope RF voltage where the power amplifier is maintained at constant gain by varying the drain supply voltage.

Correction of AM-AM characteristics (FIG. 6) by dynamically adjusting Vds is preferably combined with a corresponding correction of AM-PM response which is also a function of input power (Pin) as shown in FIG. 5. As shown in FIG. 5, the output stage amplifier exhibits a typical nonlinear response of phase vs. instantaneous input envelope RF voltage for constant RF power amplifier gain (e.g, set at 12 dB). The present invention allows for phase correction by providing control signal 18c to the phase shifting circuit 18 (FIG. 1) as a function of the detected input envelope signal. This dynamic phase correction is exemplified in FIG. 7.

Figure 7:
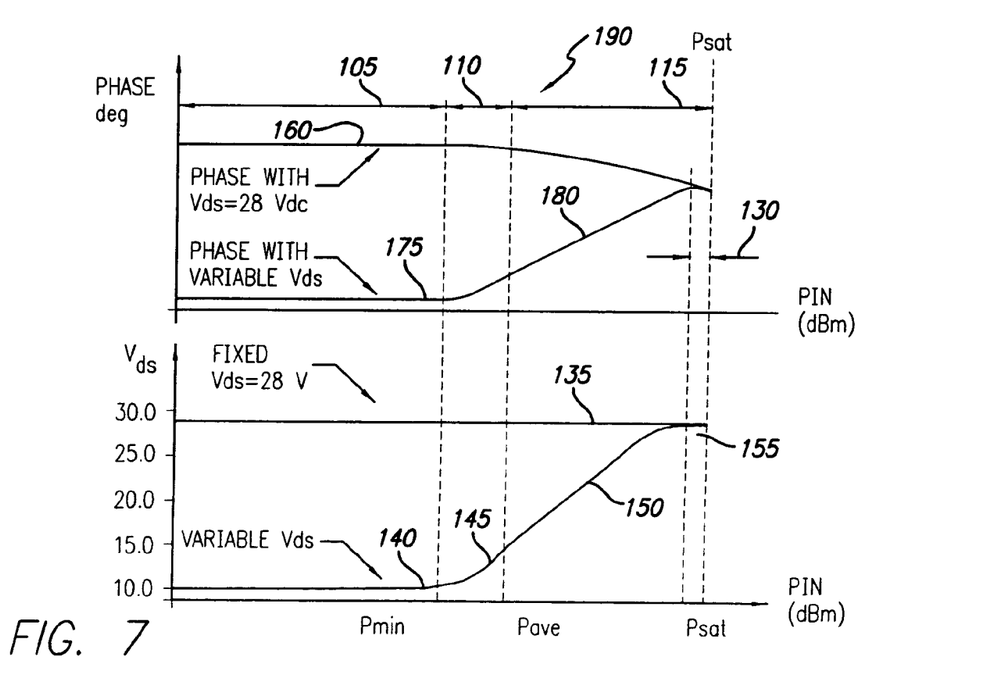
FIG. 7 is a graph showing phase vs. Pin for both a fixed Vds and for a dynamically adjustable Vds in accordance with the invention.

Now referring to FIG. 7 a graphical representation 190 of the AM-PM response for phase vs. input power (Pin) for both a fixed drain supply voltage and a variable supply voltage are shown. The regions of input power Pin 105, 110 and 115 are also shown, as in FIG. 6. The bottom curves show the voltage supply curves as a function of Pin as in FIG. 6. The present invention compensates for AM-PM nonlinear dynamic behavior introduced by the variable drain supply voltage by adjusting input phase shifter 18 with control signal 18c provided by predistorter 27 (FIG. 1) so as to compensate for insertion phase introduced by the constant gain linearization method of operation using variable drain supply voltage described above. The phase curve 160 corresponds to a fixed supply voltage and curves 175 and 180 show the phase adjustment provided by the predistorter 27 and phase shifter 18 for the variable power supply/constant gain linearization method of the present invention. As may be seen, the phase is constant in the lower input signal power region 105 and then the phase is adjusted continuously beginning in the transition region 110 and through the higher input signal power region 115. For example, the phase adjustment may increase from about 0 degrees to about 30 degrees through this region (see also FIG. 5).

Another aspect of the present invention provides gain compensation due to introduction of residual PM-AM which may be introduced as a result of phase shifter operation 18. In addition to compensating for this phase shifter 18 introduced insertion loss variability the VVA 16 may be used for long term gain compensation due to variation in operational characteristics, such as, but not limited to, ambient temperature, aging, supply voltage and the like. Furthermore, addressing this undesirable amplitude non-linearity can be corrected by in line voltage variable attenuator (VVA) 16 which is supplied with the control signal 16c from envelope predistorter 27 as shown in FIG. 1.

The various embodiments used to describe the present invention are by way of illustration only and should not be construed in any way to limit the scope of the invention. Those skilled in the art will understand that the principles of the present invention may be implemented in any suitably disposed RF power amplifier.

What is claimed is:

1. A power amplifier system, comprising:
an input for receiving an RF input signal including a modulated RF carrier having a dynamically varying envelope;
an RF amplifier receiving and amplifying the RF input signal including said carrier and envelope, the RF amplifier having a power supply input and the RF amplifier having a saturation region;
a DC power supply;
a variable power supply circuit coupled to the input, the DC power supply and the RF amplifier power supply input for providing a supply voltage to the RF amplifier which increases with the input signal power to maintain substantially constant RF amplifier gain up to the beginning of said amplifier saturation region; and
a phase compensation circuit coupled to the input for adjusting the phase of the input signal to compensate for phase variations due to the variable power supply.

2. A power amplifier system as set out in claim 1, wherein said variable power supply circuit provides a substantially constant power supply voltage over a first lower power input signal region and provides a continuously increasing power supply voltage in a second higher power input signal region.

3. A power amplifier system as set out in claim 2, wherein said power supply voltage varies from about 10 volts in said first region to about 30 volts in said saturation region.

4. A power amplifier system as set out in claim 2, wherein the phase compensation circuit comprises a phase adjuster, coupled between the input and RF amplifier for adjusting the phase of the input signal, and a predistorter providing a control signal to said phase adjuster based on the input signal magnitude.

5. A power amplifier system as set out in claim 4, wherein said predistorter controls said phase adjuster to provide little or no phase adjustment in said first input signal region and a continuously increasing phase adjustment in said second input signal region.

6. A power amplifier system as set out in claim 5, wherein said phase adjustment in said second region varies over a range of about 30 degrees.

7. A power amplifier system as set out in claim 1, wherein said RF amplifier comprises one or more LDMOS amplifier devices.

8. A power amplifier system as set out in claim 7, wherein said one or more LDMOS amplifier devices are biased in class AB.

9. A power amplifier system, comprising;
an input for receiving an RF input signal including a modulated RF carrier having having a dynamically varying envelope;
an RF amplifier receiving and amplifying the RF input signal including said carrier and envelope, the RF amplifier having a power supply input and the RF amplifier having a saturation region;
a DC power supply;
a variable power supply circuit coupled to the input, the DC power supply and the RF amplifier power supply input for providing a supply voltage to the RF amplifier which increases with the input signal power to maintain substantially constant RF amplifier gain up to the beginning of said amplifier saturation region; and
a phase compensation circuit coupled to the input for adjusting the phase of the input signal to compensate for phase variations due to the variable power supply,
wherein said variable power supply circuit comprises an envelope detector coupled to the input and an envelope amplifier responsive to the output of the envelope detector and coupled to the DC power supply and RF amplifier.

10. A method for amplifying a high frequency modulated signal, comprising:
receiving a high frequency modulated input signal having a carrier and a dynamically varying envelope providing a varying input signal power;
amplifying said high frequency modulated input signal, including said carrier and varying envelope, with a power amplifier module, said power amplifier module having a saturation region;
providing a DC supply voltage to said power amplifier module;
detecting a signal related to the power of the high frequency modulated input signal;
controlling the DC supply voltage of said power amplifier module in response to the detected signal to maintain substantially constant gain up to the beginning of said saturation region; and
adjusting the phase of the input signal to compensate for phase variations introduced by controlling the supply voltage of the power amplifier module.

11. A method for amplifying a high frequency modulated signal as set out in claim 10, wherein controlling the DC supply voltage comprises maintaining a substantially constant supply voltage over a first input signal power range and continuously increasing the DC supply voltage over a second higher power input signal power range.

12. A method for amplifying a high frequency modulated signal as set out in claim 11, wherein said second input signal power range extends from a transition region to the beginning of said saturation region of the power amplifier module.

13. A method for amplifying a high frequency modulated signal as set out in claim 11, wherein continuously increasing the DC supply voltage comprises increasing the supply voltage from about 10 volts to about 30 volts.

14. A method for amplifying a high frequency modulated signal having a carrier and a dynamically varying envelope as set out in claim 10, wherein detecting a signal related to the power of the input signal comprises detecting the envelope of the input signal.

15. A method for amplifying a high frequency modulated signal as set out in claim 10, wherein said high frequency signal is an RF CDMA or WCDMA signal.

16. A method for amplifying a high frequency modulated signal, comprising:
receiving a high frequency modulated input signal having a carrier and a dynamically varying envelope providing a varying input signal power;
amplifying said high frequency modulated input signal, including said carrier and varying envelope, with a power amplifier module, said power amplifier module having a saturation region;
detecting a signal related to the power of the high frequency modulated input signal;
providing a variable DC supply voltage to said power amplifier module in response to the detected signal which continuously increases in a higher power input signal range extending up to the beginning of said saturation region; and
adjusting the phase of said input signal with a continuously increasing phase adjustment in said higher power signal range;
wherein the gain and phase are maintained substantially constant up to the beginning of said saturation region.

17. A method for amplifying a high frequency modulated signal as set out in claim 16, wherein providing a variable DC supply voltage further comprises maintaining a substantially constant supply voltage over a lower power input signal range below said higher power input signal power range.

18. A method for amplifying a high frequency modulated signal as set out in claim 17, wherein said input signal is a CDMA or WCDMA modulated RF signal.

19. A method for amplifying a high frequency modulated signal as set out in claim 17, wherein adjusting the phase comprises adjusting the phase from about 0 degrees to about 30 degrees continuously through the higher power input signal range.

20. A method for amplifying a high frequency modulated signal as set out in claim 16, wherein detecting a signal related to the power of the input signal comprises detecting the envelope of the input signal.

* * * * *